United States Patent [19]
Dent

[11] Patent Number: 5,983,077
[45] Date of Patent: Nov. 9, 1999

[54] SYSTEMS AND METHODS FOR AUTOMATIC DEVIATION SETTING AND CONTROL IN RADIO TRANSMITTERS

[75] Inventor: Paul Wilkinson Dent, Pittsboro, N.C.

[73] Assignee: Ericsson Inc., Research Triangle Park, N.C.

[21] Appl. No.: 08/904,131

[22] Filed: Jul. 31, 1997

[51] Int. Cl.⁶ .............................. H04B 1/00; H03C 3/06
[52] U.S. Cl. ............................ 455/44; 455/113; 332/128
[58] Field of Search .................................... 455/110, 112, 455/113, 118, 42, 44; 332/128, 127; 331/23, 17; 375/373, 376

[56] References Cited

U.S. PATENT DOCUMENTS

| | | | |
|---|---|---|---|
| 3,882,424 | 5/1975 | Debois et al. | 332/127 |
| 4,271,530 | 6/1981 | Van Deursen | 455/182.1 |
| 4,387,470 | 6/1983 | Maurier et al. | 455/257 |
| 4,453,136 | 6/1984 | Kelland | 331/1 A |
| 4,494,090 | 1/1985 | Popek et al. | 332/124 |
| 4,543,542 | 9/1985 | Owen | 332/128 |
| 4,581,749 | 4/1986 | Carney et al. | 375/302 |
| 4,727,591 | 2/1988 | Manlove | 455/182.2 |
| 4,810,977 | 3/1989 | Flustad et al. | 332/127 |
| 4,969,210 | 11/1990 | Hansen et al. | 455/188.1 |
| 4,994,768 | 2/1991 | Shepherd et al. | 332/127 |
| 5,408,695 | 4/1995 | Dorr | 455/226.1 |
| 5,473,640 | 12/1995 | Bortolini et al. | 375/376 |
| 5,483,203 | 1/1996 | Rottinghaus | 331/10 |
| 5,517,491 | 5/1996 | Nanni et al. | 370/252 |
| 5,585,751 | 12/1996 | Iizuka | 327/113 |
| 5,590,402 | 12/1996 | Samson et al. | 455/44 |
| 5,697,068 | 12/1997 | Salvi et al. | 455/76 |
| 5,742,641 | 4/1998 | Dingsor | 375/222 |

FOREIGN PATENT DOCUMENTS

| | | |
|---|---|---|
| 0 360 422 | 3/1990 | European Pat. Off. |
| 0 423 941 | 4/1991 | European Pat. Off. |

OTHER PUBLICATIONS

International Search Report, PCT/US98/15665, Nov. 16, 1998.

*Primary Examiner*—Reinhard J. Eisenzopf
*Assistant Examiner*—Charles N. Appiah
*Attorney, Agent, or Firm*—Myers Bigel Sibley & Sajovec

[57] ABSTRACT

A frequency modulation (FM) radio transmitter, such as a cellular telephone, includes an automatic deviation control system to automatically compensate for varying sensitivity of the FM transmitter. The FM transmitter includes a phase lock loop including a controlled oscillator that produces a frequency modulated input signal on an output channel frequency in response to a control input that is applied thereto. A scaler is responsive to the input signal and to at least one scaling content, to scale the input signal based upon the at least one scaling constant and to provide the scaled input signal to the phase lock loop to produce the frequency modulated input signal on the channel frequency. An automatic deviation control system measures the control signal that is applied to the controlled oscillator when tuned to one of the plurality of output channel frequencies and updates at least one of the scaling constants based upon the measured control input, to thereby provide automatic deviation control.

25 Claims, 3 Drawing Sheets

SYSTEMS AND METHODS FOR AUTOMATIC DEVIATION SETTING AND CONTROL IN RADIO TRANSMITTERS

FIELD OF THE INVENTION

The present invention generally relates to radio communications, and more particularly to frequency-modulation in radio transmitters.

BACKGROUND OF THE INVENTION

FM transmitters can impress voice signals on a radio frequency by applying a voiceband voltage signal to a voltage controlled oscillator operating at an output frequency. The mean frequency is accurately controlled to a desired channel frequency relative to an accurate crystal reference with the aid of a phase-lock loop or frequency synthesizer. The voiceband signal causes instantaneous deviation of the frequency from the mean in step with the voice waveform from the microphone.

This relationship between voice signal and frequency deviation generally should be controlled to tight tolerances. Too great a deviation may cause the signal to stray momentarily into neighboring channels causing "splatter" interference. Too little deviation may reduce the speech volume at the receiver and impair intelligibility under noisy conditions. The uncertainty in deviation in such FM transmitters arises from the variability of the sensitivity of the voltage controlled oscillator to the voiceband signal, expressed in Megahertz of frequency deviation per volt.

At least two known prior art radio products employed digital scaling of frequency modulating signals to compensate for voltage controlled oscillator sensitivity variation. A radio offered by the Marconi company between about 1980–1985 known as SCIMITAR-V employed a Read Only Memory to store modulation scaling coefficients as a function of Voltage Controlled Oscillator (VCO) frequency or channel number. A derivation of this radio known as STARCOMM was jointly developed by Marconi of England and Ericsson (the current assignee) and included the same technique for compensating VCO slope variation.

This technique is generally described below with reference to FIG. 1. As shown in FIG. 1, controlled oscillator such as a VCO 10 produces an output at point B that is frequency modulated by a modulating signal presented to the input at point A. The VCO is controlled to oscillate at a desired channel center frequency by the fractional-N synthesizer loop comprising loop filter 11, phase error detector 12 and fractional-N synthesizer or divider 13. More details of the operation of fractional-N synthesizers, phase detectors and design of loop filters can be found in U.S. Pat. Nos. 5,095,288 and 5,180,933 to the present inventor, which patents are hereby incorporated by reference herein.

The modulation signal from input A frequency modulates the output signal frequency via two paths, known as two-point modulation. The two paths are sometimes known as "in-loop" and "out-of-loop" modulation, or "closed loop" and "open loop" modulation. The closed loop modulation is applied by digitizing the modulation signal using analog to digital convertor 14 to obtain a series of numerical samples representing the modulating waveform. The numerical sample values are digitally added to the channel code N+dN by the fractional-N synthesizer 13 to determine the instantaneous channel frequency plus the instantaneous frequency deviation due to modulation. The fractional-N divider 13 then causes the phase lock loop to attempt to control the VCO 10 to this value.

When the modulation attempts to change frequency more rapidly than the loop can follow, the modulation may not faithfully be transferred to the VCO due to the bandwidth limitation imposed by loop filter 11. The open loop modulation may then be applied to the VCO directly, bypassing the loop filter. This can be thought of as forewarning the VCO of the coming frequency change the loop will demand. The VCO is then able to adopt the new frequency more or less simultaneously with the phase lock loop demanding the change, so that reduced error occurs in the loop. Therefore, the loop filter may not impose a bandwidth limit on the modulation.

The direct modulation is preferably applied to the VCO at a point where a flat modulation frequency response will result. It can, in principle, be applied by voltage addition after loop filter 11, but it is undesirable to attach additional components to the VCO control line due to its extreme sensitivity to interference pick up. Therefore the direct modulation is preferably applied as another input to the loop filter, using components $\alpha \cdot Ro$ and $Co/\alpha$ as impedance-scaled versions of the loop filter components Ro,Co. Since the time constant of $(\alpha \cdot Ro)(Co/\alpha)$ is the same as RoCo, the resulting frequency response is flat and scaled down by the factor $\alpha$ from the modulation sensitivity available on the VCO control line. The series capacitor $Co/\alpha$ also has the desirable effect of isolating the VCO from whatever DC level may exist at point A, which may not be the same as the DC level on the VCO control line since this is frequency channel dependent.

When the VCO has to be tuned over a wide range of channel frequencies, the frequency versus control voltage is unlikely to be perfectly linear, so that the tangential modulation sensitivity dF/dV generally is not of constant slope but varies with frequency. This characteristic curve was nevertheless anticipated to be constant in the design of FIG. 1 and scaling values compensating for this fixed curve are precomputed and stored in ROM 16. Indeed, the VCO adjustment needed in any case in factory production can be used to ensure that the nominal curve of tangential modulation sensitivity versus frequency channel is reproduced in each unit. Compensation for the variation of tangential modulation sensitivity versus frequency can be achieved by scaling the direct modulation signal using a multiplying DtoA convertor 15 which multiplies an analog input signal at point A by an 8-bit digital number representing values between 0/256 and 255/256 in steps of 1/256.

The 8-bit scaling constants to equalize the modulation deviation at all channel frequencies are precomputed and stored in memory such as read only memory (ROM) 16. These values were generally not adapted from one model to another and were generally not updated after delivery from the factory. In order to use a fixed ROM table of scaling values, however, manual alignment and adjustment of the VCOs in the factory may be required in order to achieve an expected tangential modulation sensitivity curve.

SUMMARY OF THE INVENTION

The present invention provides automatic deviation setting and control in frequency modulation (FM) radio transmitters so that the deviation can be controlled notwithstanding variations in the sensitivity of the controlled oscillator as a function of frequency, temperature, time and/or other factors. Accordingly, accurate scaling constants may be used during the life of the transmitter.

In particular, FM radio transmitters according to the invention frequency modulate an input signal on one of a plurality of output channel frequencies. The FM radio transmitter comprises a phase lock loop including a controlled oscillator which produces the frequency modulated input signal on one of the plurality of output channel frequencies in response to a control input that is applied thereto. A scaler is responsive to the input signal and to at least one scaling constant. The scaler scales the input signal based upon the at least one scaling constant and provides the scaled input signal to the phase lock loop to produce the frequency modulated input signal on one of the plurality of channel frequencies. An automatic deviation control system measures the control input that is applied to the controlled oscillator when tuned to one of the plurality of output channel frequencies, and updates at least one of the scaling constants based upon the measured control input. Automatic deviation control of the frequency modulated input signal on the plurality of channel frequencies is thereby provided.

The sensitivity of the voltage controlled oscillator may be measured by computing the slope of the voltage controlled oscillator frequency/voltage characteristic obtained by the above measurements. The value of the slope at a selected frequency of operation may then be used to scale the input signal to thereby obtain a desired modulation frequency deviation. The scaling may, for example, be facilitated by digitizing the input signal using an analog-to-digital converter where necessary, performing premodulation filtering, companding, deviation limiting or any other conventional signal conditioning function using digital signal processing. The resulting number stream may then be scaled by multiplying each value with the scaling constant before digital-to-analog conversion to obtain a scaled baseband signal for application to the frequency control input of a controlled oscillator. In this way, correct frequency deviation may be obtained even when then controlled oscillator slope sensitivity is different at different frequencies or when it changes from model to model, time to time or with temperature.

Many techniques may be used for repeatedly measuring the control input that is applied to the controlled oscillator and updating at least one of the scaling constants, to provide automatic deviation control. In particular, the control input that is applied to the controlled oscillator may be measured first during manufacture thereof and at least one of the scaling constants may be set. The control input that is applied to the controlled oscillator may again be measured during operation thereof after manufacture, and the at least one of the scaling constants updated. Repeated or periodic updates may be made.

In another embodiment, the automatic deviation control system repeatedly measures the control input that is applied to the controlled oscillator at a first plurality of output channel frequencies and computes the scaling constants for a second plurality of output channel frequencies. Alternatively, automatic deviation control may repeatedly measure the control input which is applied to the controlled oscillator at some of the plurality of output channel frequencies, and compute updated scaling constants for other or all of the plurality of output channel frequencies by interpolation. The interpolation may be linear interpolation, quadratic interpolation, higher order interpolation or other conventional interpolations.

In yet another embodiment, the automatic deviation control system may measure the control input that is applied to the controlled oscillator in response to a user command such as first turning on the apparatus after a period of non-use. In another embodiment, the automatic deviation control system can scan the controlled oscillator through a plurality of channel frequencies, measure the control input that is applied to the controlled oscillator at the plurality of channel frequencies and update the scaling constants corresponding to the other or all channel frequencies.

In other embodiments, the control input that is applied to the controlled oscillator is measured each time power is applied to the FM radio transmitter. Alternatively, the control input that is applied to the controlled oscillator can be measured even during frequency modulation of one of the channel frequencies, by averaging out the frequency modulation using a filter to obtain the mean value of the control input. The scaling constants may be updated for at least one channel frequency based upon the measurement of the mean control input.

The automatic deviation control system may include an analog-to-digital converter which converts the oscillator control input into a digital signal, and a control processor which is responsive to the digital signal to calculate at least one modulation scaling constant. The scaler may comprise a digital signal processor which is responsive to the input signal and to the at least one scaling constant. The digital signal processor scales the input signal based upon the at least one scaling constant and provides the scaled input signal to the phase lock loop to produce the frequency modulated output signal on one of the plurality of channel frequencies.

The present invention is particularly advantageous for cellular radiotelephones wherein the sensitivity of the voltage controlled oscillator may deviate over the range of cellular telephone channel frequencies and may also deviate over time and/or temperature.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The present invention is described in the context of a fractional-N synthesizer using 2-point modulation. Such an arrangement is capable of implementing either conventional analog (audio) FM or digital data frequency modulation using modulation methods such as Gaussian Minimum Shift Keying (GMSK) or Continuous-Phase Frequency Shift Keying (CPFSK).

Figure 1:
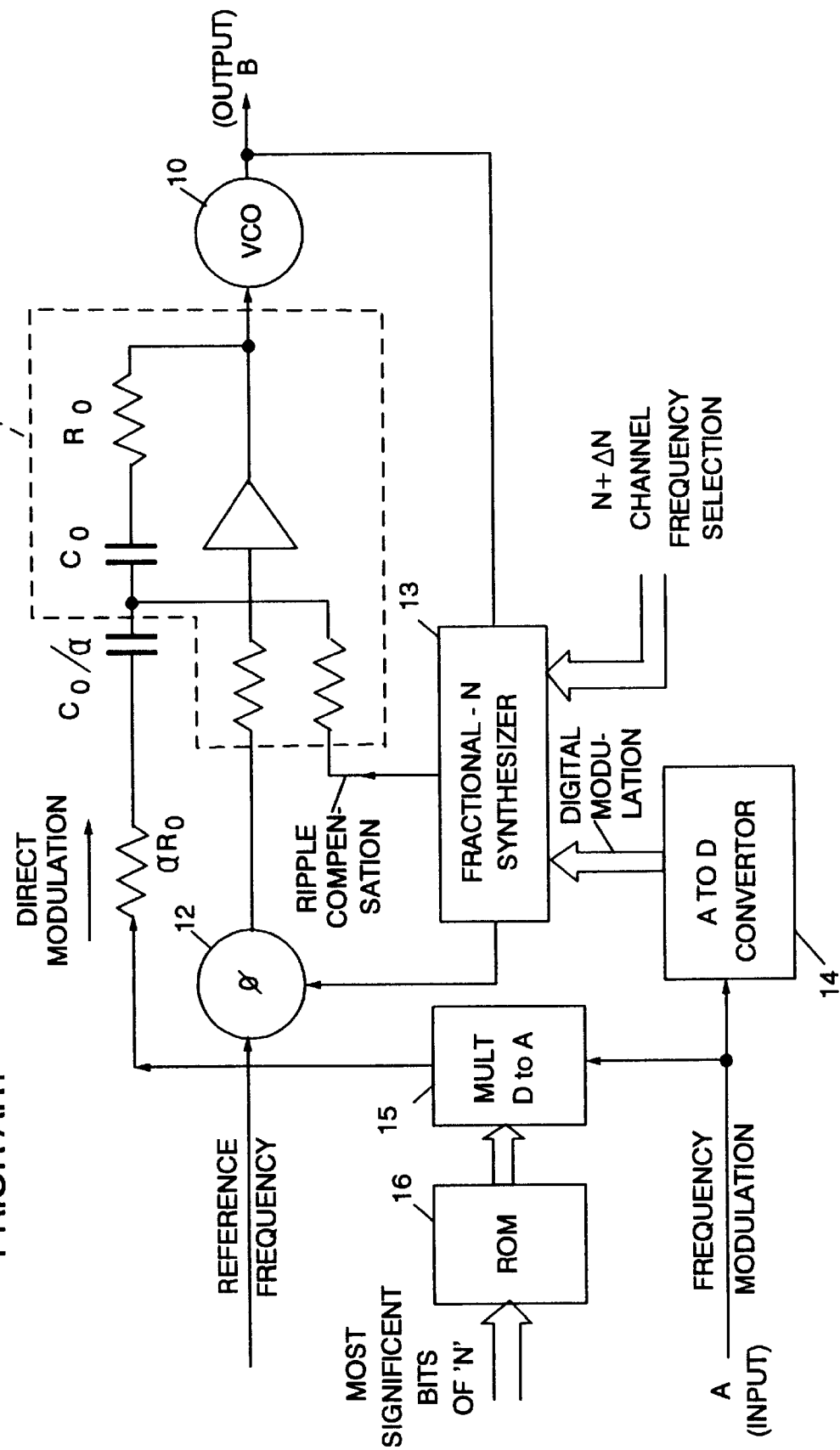
FIG. 1 is a block diagram of a conventional FM transmitter including modulation compensation.
Figure 2:
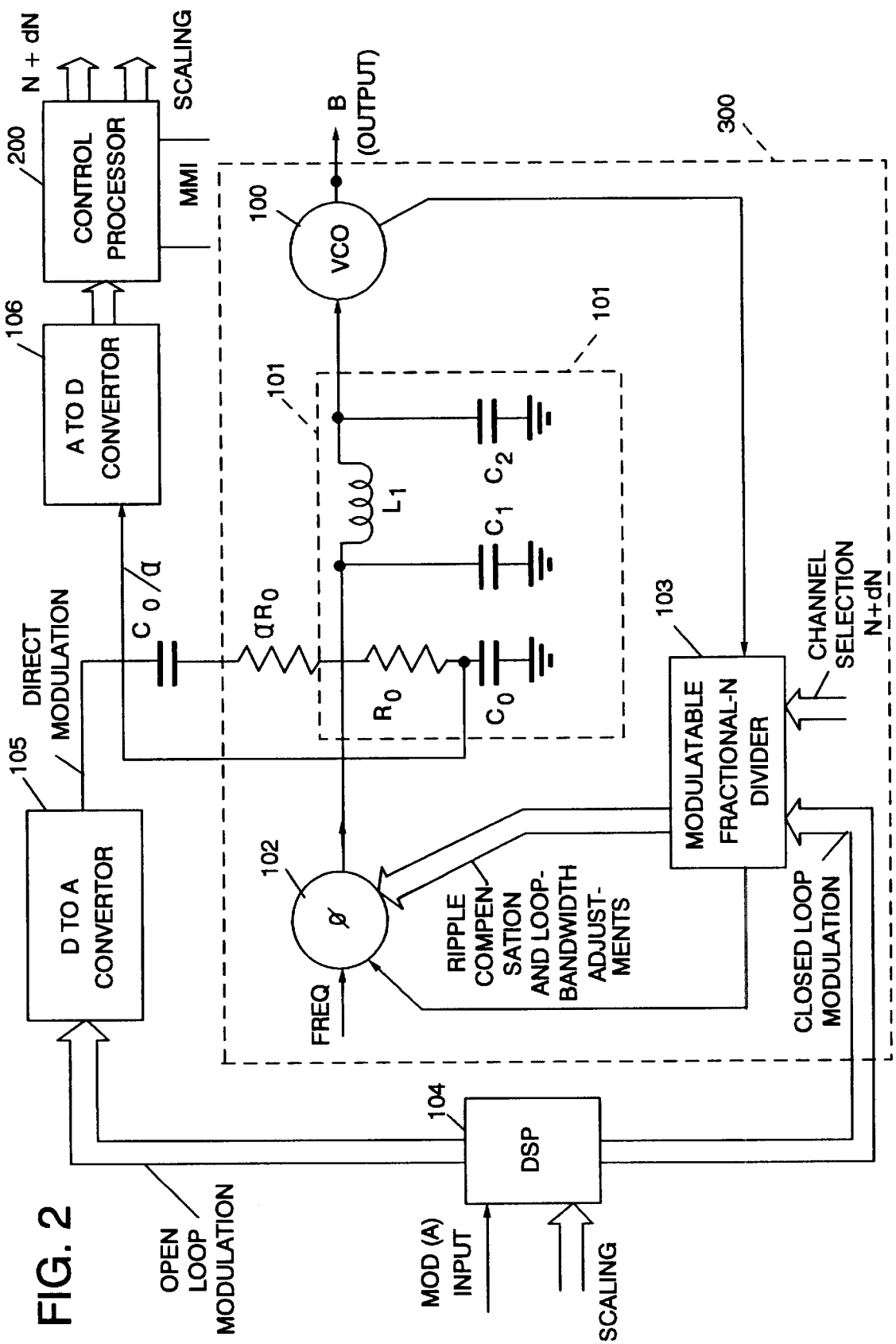
FIG. 2 is a block diagram of an FM transmitter including automatic deviation control according to the present invention.

With reference to FIG. 2, a phase lock loop synthesizer 300 is comprised of a controlled oscillator such as a Voltage Controlled Oscillator (VCO) 100, loop filter 101, a phase detector 102, and a synthesizer control circuit 103. The phase lock loop synthesizer 300 also includes an input for a direct or open loop frequency modulation signal to be injected and an output for measuring the mean control voltage used to tune the VCO to a given channel frequency. The phase detector 102 is preferably of charge pump type and the digital synthesizer control circuit 103 is preferably of fractional-N type. The synthesizer 300 may comprise the type disclosed in the aforementioned incorporated U.S. patents.

A digital signal processor 104 generates frequency modulating signals as a series of numerical samples. The digital modulation samples can be fed directly to the fractional-N synthesizer control circuit 103 to apply closed loop modulation, which is optional, particularly in a pure analog (audio) FM application. Closed loop modulation may not require scaling as a function of channel frequency and may not have to be DtoA converted. Closed loop modulation may be applied by causing the fractional-N divider to divide by N or N+1 according to a sigma-delta modulation pattern as described in cofiled U.S. application Ser. No. 08/902,836, entitled "Frequency Synthesizer Systems and Methods for Three-Point Modulation With a DC Response" to the present inventor (Attorney Docket 8194-87), the disclosure of which is hereby incorporated by reference herein.

The open-loop modulation generated by the DSP is scaled as a function of channel frequency by using the scaling constant supplied from control processor 200. The scaled open loop modulation is then output from the DSP 104 and converted to an analog modulating signal using a DtoA convertor 105, which can include interpolating low-pass filters to reconstruct a continuous-time signal from a series of discrete waveform samples. The DtoA convertor 105 can also employ sigma-delta modulation as described in the incorporated and cofiled application. The analog modulation signal from the DtoA convertor 105 is then added into the PLL control loop 101 via the resistor of value $\alpha Ro$ and a capacitor of value $Co/\alpha$ to provide a flat modulation frequency response.

Control processor 200 can implement the inventive function of automatically determining the scaling constant that should be used for a particular VCO and channel frequency, so that the frequency deviation of the output signal by the modulation can be held within tighter tolerances. Control processor 200 is able to determine the scaling constants by measuring the VCO's frequency versus voltage (or current) control curve using AtoD convertor 106 to sample the mean VCO control signal and convert it to digital form. The control processor controls the AtoD convertor 106 to sample and digitize the VCO control signal at a time when the VCO is expected to have settled after a change in frequency to a new frequency, by allowing enough settling time before making the measurement.

The measurement of control voltage is preferably made at the top of the principal integrator capacitor of value Co as shown in FIG. 2, for at least the following reasons: First, it is a less interference-sensitive point to which to connect the AtoD converter 106. Moreover, the voltage on the capacitor is nearer a true mean value and less affected by loop noise and transients. Finally, the modulation is attenuated by the filtering action of resistor Ro and the capacitor Co and will thus not corrupt the measurement. However, the measurement can be made at any other suitable point of the VCO control path.

In a handheld radio application such as cellular phones, control processor 200 is connected to a Man-Machine Interface (MMI) which is a generic term for transducers such as keyboards, displays, or buzzers which inform the human user about status and accept commands from the keypad. The control processor 200 can also receive information via a receiver (not shown) from a network or base station (not shown) which allocates frequency channels to use for transmission in response to a service request initiated via the MMI for example.

When a channel is allocated for transmission, control processor 200 determines a corresponding synthesizer programming code comprising at least N (and dN if a fractional-N synthesizer is used) and sends the programming code on a buss to the synthesizer. After a few milliseconds, when the synthesizer is expected to have settled to the allocated channel frequency, control processor 200 causes AtoD convertor 106 to sample and measure the VCO control signal level V and reads it from the AtoD convertor 106. Thus a corresponding pair of coordinates (N,V) is obtained every time a new frequency control code N is programmed.

In the factory when a product incorporating the invention is being manufactured, the product can be caused to sequentially tune its synthesizer through all possible channels and to record V versus N for all channels in the microprocessor's EPROM or EEPROM (Electrically Programmable Read Only Memory or Electrically Erasable and Programmable Read Only Memory). It will be understood that an EEPROM is a type of Read and Write memory, the contents of which are remembered when power is off, i.e. non-volatile memory. Random Access Memory may be rendered non-volatile using battery back-up, but may not be preferred. Another alternative is to use volatile RAM which loses its contents if the main battery is removed or discharged, and to always execute the factory set-up procedure anew upon power-up, whereby a number of channels are selected sequentially and the corresponding synthesizer control voltages are recorded.

It will often not be necessary to make measurements on all possible channels. For example, in an analog FM cellular phone such as an AMPS phone, channels are spaced 30 KHz apart over a 25 MHz total bandwidth providing about 400 channels in total. However, it can suffice to make a tuning voltage measurement on 25 channels at 1 MHz intervals, or 50 channels at 500 KHz intervals. The sampling density need only be sufficient to capture the main changes of slope of the VCO control characteristic.

Given a table of control signal values V versus channel number N, which may not include a value for every channel number, control processor 200 can estimate the tangential modulation sensitivity, that is the slope in Megahertz or Kilohertz change in frequency per unit change in the control signal for any channel number, including channel numbers not included in the table. This estimate can be made by a combination of interpolation or curve fitting combined with numerical differentiation of the curve to determine the slope $dF/dV$.

The fact that the table of control voltage is measured versus channel frequency rather than channel frequency versus control voltage may not be a hindrance, as the independent variable and the dependent variable can be reversed as long as the curve is monotonic. For example, control processor 200 can determine the inverse of the tangential modulation sensitivity, that is $dV/dF$. This is directly related to the scaling constant required when scaling is by multiplication. If $dF/dV$ is computed, then scaling would be by division by that value. Since multiplication is generally simpler than division, it is convenient to compute $dV/dF$, although $dF/dV$ could be computed and its reciprocal taken.

The control processor does not need to recompute the scaling constant every time a new measurement is made. Rapid changes in VCO characteristics are not expected, so it can suffice to make an offline update to stored table values so as not to place a real-time burden on processor 200. The updating of values using recent measurements can for example be performed as a background task.

Algorithms of various degrees of sophistication can be programmed in control processor 200 for determining the scaling constant dV/dF for a given channel. Three will be described: linear interpolation, quadratic interpolation and higher order interpolation.

Linear Interpolation

When the current channel number N lies between N1 and N2 it can be assumed that the slope dV/dF is just (V2−V1)/(N2−N1) where V2 and V1 are voltages measured at N2 and N1 respectively on previous occasions. Those voltages may be updated after a new voltage V is measured at the current channel N. In other words, measurements made at channels intermediate between those for which data are stored in a table in processor 200 can be used to update values stored at the table points.

Quadratic Interpolation

It is assumed that the control voltage is related to channel number by a second order polynomial (quadratic) as follows:

$$V = aN^2 + bN + c$$

Then, if the current channel N lies between $$\frac{N2 + N1}{2}$$

and $$\frac{N3 + N2}{2}$$

where N3,N2 and N1 are table points, the following procedure may be performed:

Compute:

$$D2 = \frac{V3 - V2}{N3 - N2}; \quad D1 = \frac{V2 - V1}{N2 - N1}$$

$$a = \frac{D2 - D1}{N3 - N1}; \quad b = \frac{V3 - V1}{N3 - N1} - a(N3 + N1)$$

Then the inverse tangential sensitivity dV/dF at channel N is 2aN+b.

When table points N3,N2,N1 are equispaced and the spacing regarded as one unit of frequency, i.e. N3−N2=N2−N1=1 and N3−N1=2, and Nr can be arbitrarily chosen as the origin (i.e. zero frequency) then N3=+1 and N1=−1 and the above simplifies to:

$$a = \frac{V3 - 2 \cdot V2 + V1}{2}; \quad b = \frac{V3 - V1}{2} \quad (1)$$

The inverse tangential sensitivity dV/dF is then 2a(N−N2)+b, or dV/dF=(V3−2.V2+V1)(N−N2)+(V3−V1)/2.

Alternatively, the value 2dV/dF is of equal validity as a scaling factor, giving 2dV/dF=2(N−N2)(V3−2.V2+V1)+(V3−V1).

Values 4dV/dF or 8dV/dF may also be used. The choice is related to the art of manually keeping track of the position of the point when attempting to minimize rounding error in programming fixed point calculations, which will be understood by a person of normal skill in the art and does not need to be described further here.

In the above definition of origin and units, N−N2 will always be between −½ and +½. Since voltages Vi will most likely be stored to no more than 8-bit accuracy, excessive precision in the computation is generally unwarranted. 8-bit, i.e. single byte quantities are likely to suffice. If differences between 8-bit quantities such as V3−V1 are very small, only a few LSBs, it is an indication that table values are too close together and fewer can be used. Alternatively, the points (N3,V3),(N2,V2),(N1,V1) chosen for performing quadratic interpolation can be further apart than one point in the table in order to obtain a larger difference V3−V2.

Higher Order Interpolation

Higher order interpolation, such as cubic interpolation, can be used but is unlikely to prove necessary. Other approaches such as curve fitting can be used, where quadratic coefficients (a,b) are computed that give a curve that passes most closely, in the minimum sum square error sense, through more than three points. A quadratic passes exactly through just three points. However these approaches are generally more complicated than necessary and other alternatives will be explained in connection with table updating.

Continuing with the description of FIG. 2, the computation by control processor 200 of an inverse sensitivity dV/dF to be used as a multiplicative modulation scaling factor relies upon the existence in memory of a current table of values of VCO control signal V versus frequency channel number N. The table can be first constructed in the factory, but preferably continues to be automatically updated during the life of the product. If suitable opportunities arise, the apparatus can remeasure the entire table periodically. A command menu item captioned "recalibrate" can be included in the Man-Machine Interface to allow either the user or service personnel to trigger such operations.

An alternative will now be described to illustrate how the table can be updated in normal service after every single new measurement of a point (N,V). If the control parameter is stored only to 8-bit accuracy, then the least change it is possible to make is one LSB. If this is too coarse, the V-values can alternatively be stored to 16-bit accuracy even if they can be measured only to 8-bit precision and even if only the most significant 8 digits need be used to calculate the value of dV/dF with adequate precision.

It may be seen from Equation (1) that a calculation of quadratic coefficients (a,b) is very simple even with 16-bit V-values, needing no more than 16-bit addition, subtraction and a right shift for division by two if necessary. The value of N−N2 is a fractional value if table values are considered to be spaced by one frequency unit. Alternatively, N−N2 is an integer value if the N-values are integer channel numbers. Then, if table values are equispaced by more than one channel, N3−N2=N2−N1=dN is greater than unity.

The value of dV/dF is then given by:

$$dV/dF = (V3 - 2 \cdot V2 + V1)/dN^2 + (V3 - V1)/(2dN)$$

The division can be eliminated by computing $$2dN^2 \cdot dV/dF = 2(V3 - 2 \cdot V2 + V1) + (V3 - V1) \quad (2)$$

which can be used as a scaling factor. If desired, table spacing dN can be chosen to be a number of channels equal to a power of two, so that the value of dV/dF is given by Equation (2) with an appropriate right shift or imagined point placement to account for the power of two factor $2dN^2$.

Likewise, the values of 'a' and 'b' are given by:

$a=(V3-2\cdot V2+V1)/2dN^2$ and $b=(V3-V1)/2dN$ but the divisions by $2dN^2$ and $2dN$ can be omitted if dN is chosen to be a power of two, and instead the implied position of the point must be remembered when the division by a power of two is omitted. Thus new values of a and b, denoted by A and B are defined as:

$A=(V3-V2)-(V2-V1)$ and $B=(V3-V2)+(V2-V1)$ which are simply values of a and b scaled by the factors $2dN^2$ and $2dN$ respectively.

When a new measurement V is made on a channel number N, the value of V can be compared with that expected by interpolation using the current stored table values. Table points N3,N2,N1 are found such that N lies closest to N2. Then, after computing A and B the expected value of V is computed from $A(N-N2)^2/2dN^2+B(N-N2)/2dN.$ Alternatively, compute:

$V'=A(N-N2)^2+BdN(N-N2)$ which is scaled by $2dN^2$, and when dN is a power of two, this is equivalent to a left shift of the bit pattern. V' is then compared with the measurement V, taking regard to left shift V an equal number of places, in order to determine the error 'e' between the predicted and the measured value, i.e.:
$e=2^m\cdot V-V'$, where $2dN^2=2^m$.

The V-values stored in the table should now be updated in such a direction as to reduce the error, but preferably not all the way, as some averaging may be desired over many measurements. Since three values V1,V2,V3 contribute to making the prediction V', and N lies somewhere in the middle of the three values N1,N2 and N3, all of V1,V2 and V3 may be up from the single new measurement. According to the principle of Kalman filtering, the sensitivity or gradient of V' with respect to changes in V1,V2 and V3 may be determined as follows:

$$grad(V') = \begin{bmatrix} dV'/dV1 = (dV'/dA)(dA/dV1) + (dV'/dB)(dB/dV1) \\ dV'/dV2 = (dV'/dA)(dA/dV2) + (dV'/dB)(dB/dV2) \\ dV'/dV3 = (dV'/dA)(dA/dV3) + (dV'/dB)(dB/dV3) \end{bmatrix}$$

i.e., $grad(V') = \begin{bmatrix} (N-N2)+dN \\ -2 \\ (N-N2)-dN \end{bmatrix}(N-N2)$ To drive the error 'e' to zero, V' should in principle be updated according to the following equation:

new V'=old V'+e·grad(V')

However, this method may produce the paradoxical result that, when N is close to N2, e.g. if N−N2=1 channel, (and let the table spacing dN=8 for example) then point V2 is updated away from the new measurement by an amount −2e while V1 and V2 are updated by a larger amount towards the new measurement by amounts 8e and 7e respectively. This may not provide a converging learning process as the quadratic term is magnified at each update.

Alternatively, it may be postulated that the main reason for an error is that the whole curve of voltage versus frequency has merely shifted up or down by a constant amount due to a temperature change for example. If this assumption were true, then all points would be updated by an equal shift in a direction which minimizes the error. However, no change to the slope of the curve would ever be learned.

It therefore may be preferred merely to update the value of V2 towards the measured value V by an amount proportional to the error 'e', so that no change is made if the error is zero, which is logical. V2, being the table point closest to the channel N on which the most recent measurement was made, is thus updated by the formula:

new V2 value=old V2 value+e/$2^q$, or or new V2=old V2+DELTA, where DELTA=e/$2^q$ (3)

where $2^q$ is chosen as a power of two to simplify division to a right shift and is chosen large enough that each new measurement has only a small effect on the table values, giving an averaging effect.

Suppose now that a recalibration operation was performed in which new measurements were made at all table points, and that the value of e computed above was approximately the same at all table points. It would then make sense to shift all points on the curve by the mean of all the 'e' values. An approximation to this behavior can be obtained by modifying the updating algorithm to update all table points, but updating those further from the new measurement point by a lower amount than those nearer to it.

For example, a new V2 value can be calculated using equations (3), and then V1 and V3 lying on either side of V2 can be updated by adding DELTA/2; Vo and V4 lying two points away from V2 can be updated by DELTA/4, and so on, where DELTA is the difference between the old and new V2 values.

Figure 3:
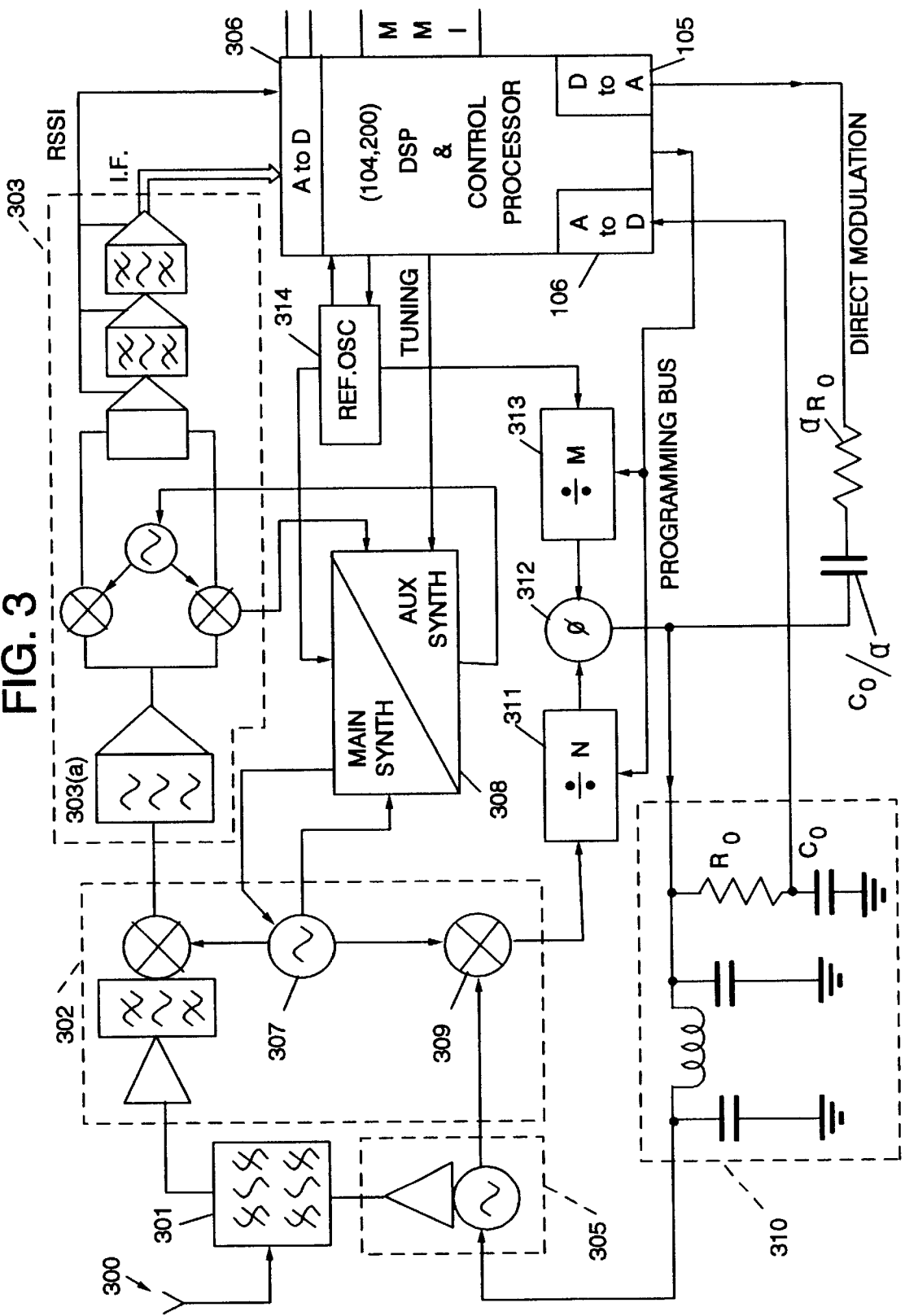
FIG. 3 is a block diagram of a cellular radiotelephone employing automatic deviation control according to the present invention.

FIG. 3 illustrates the use of the invention in a two-way radio telephone such as a cellular phone. In FIG. 3, a receiver chain for receiving information from a network station comprises antenna 300, transmit/receive duplexing filters 301 to permit the transmitter and receiver to operate simultaneously using the same antenna 300, receive downconvertor 302, first intermediate frequency filter 303a, second downconvertor and I.F. amplifier subsystem which provides received signal strength information (RSSI) and hardlimited 2nd IF signals into signal processor 104, 200 which contains DSP 104 and control processor 200 of FIG. 2 as well as AtoD convertors 306a, and which can also include the logpolar convertor of U.S. Pat. No. 5,048,059 which is hereby incorporated by reference herein. Processor 104, 200 demodulates received signals to decode speech or data traffic and signalling messages, and drives the earpiece, buzzer and display of the Man Machine Interface.

Downconvertor 302 incorporates first local oscillator 307 which is controlled by the main frequency synthesizer circuit 308. Circuit 308 can also include a second, fixed frequency synthesizer for controlling the second local oscillator part of IF system 303. First local oscillator (LO) 307 is tuned to different channels by control processor 200 sending programming information to main synthesizer 308, according to the channel allocated for communications.

It is typical in two-way or duplex radio systems for the transmitter frequency always to be a constant frequency offset away from the receive channel frequency. This offset is called the duplex spacing, and is chosen to be large enough so that the transmitter does not interfere with the receiver and that the duplexor 301 is physically realizable. The transmitter in this example for transmitting frequency modulated signals preferably comprises a combined oscillator/power amplifier module 305 for generating a transmit signal at a center frequency Ftx. Denoting the receive frequency channel by Frx, the relation $$Frx-Ftx=DUPLEX\ SPACING \quad (4)$$

applies.

Denoting the frequency of local oscillator 307 by Flo, and the 1st intermediate frequency by IF1, the relation $$Flo-Frx=IF1\ or\ Frx-Flo=IF1 \quad (5)$$

applies. The latter is called "low side" mixing because Flo is lower than Frx, while the former is called "high-side" mixing, because Flo is greater than Frx, which is more commonly used.

Adding (4) and (5) gives Flo−Ftx=IF1+DUPLEX SPACING=Ftxoff, which is called the transmit offset frequency. Ftxoff is the amount by which the receive local oscillator 307 frequency differs from the desired transmit frequency. Transmit downconvertor 309 mixes the transmitter frequency signal from PA/VCO 305 with LO 307 to produce a signal that should equal Ftxoff. The signal is divided by N in divider 311 and compared in phase comparator 312 with a reference frequency. The reference frequency is produced by dividing a signal from reference oscillator 314 by 'M' in divider 313. At least one, and preferably both of dividers 311, 313, has division ratio N,M or both) controlled by a signal on a programming bus from processor 104. This can be a sigma-delta signal that alternates the division ratios in a pattern designed to produce a mean division ratio such that the error signal from phase comparator 312 is zero in the mean when the PA/VCO is producing the correct transmit frequency and downconvertor 309 is producing the expected frequency Ftxoff. Loop filter 310 filters the phase error signal from comparator 312 to produce a frequency control signal for PA/VCO 305. The sigma-delta pattern of successive division ratios is also chosen to provide the desired frequency modulation, that is the closed-loop modulation part of a two-point modulation system, as described in more detail in the aforementioned cofiled U.S. Patent Application.

The phase lock loop comprising PA/VCO 305, dividers 311, 313, phase error detector 312 and loop filter 310 can employ any or all of the improvements described in the incorporated applications, including controlling both dividers 311, 313 and controlling the gain or current output level of phase detector 312 so as to maintain constant loop bandwidth. Specifically, it is advantageous to choose internal frequencies such as IF1 such that the ratio Ftxoff/Fref, where Fref is the frequency of reference oscillator 314, lies between two ratios N1/M1 and N2/M2, both of which are close to the ratio Ftxoff/Fref but on opposite sides. Then, alternating between programming 311, 313 with (N1,M1) and with (N2,M2) according to a sigma-delta bit pattern will produce a desired modulation with lowest quantization noise.

The open-loop part of the modulation is applied from DSP 104 via DtoA convertor and series components Co/α, α·Ro, and can include ripple compensation for canceling unwanted modulation caused by the pattern of alternating division ratios as well as wanted modulation, as described in the incorporated application.

The current invention may be embodied by extracting a sample of the frequency voltage for PA/VCO 305 from loop filter 310 and AtoD converting it using convertor 106 and reading the converted value into control processor 200 or alternatively DSP 104. Thus a table can be built up in processor memory of control voltage versus the channel to which PA/VCO 305 is tuned, and hence a scaling compensation for the open-loop modulation can be learned as described above.

Many methods of updating table values can be devised by a person skilled in the art, and can be tested by simulation first, using a model for likely variations in VCO characteristics due to temperature, supply voltage etc. in order to verify that the chosen algorithm is well-behaved.

All such variations are considered to lie within the scope and spirit of the inventive method of determining a modulation scaling constant using values of VCO tuning voltage versus channel frequency measured and recorded while the apparatus is caused to tune to various channel frequencies during normal operation or use.

In the drawings and specification, there have been disclosed typical preferred embodiments of the invention and, although specific terms are employed, they are used in a generic and descriptive sense only and not for purposes of limitation, the scope of the invention being set forth in the following claims.

I claim:

1. A frequency modulation (FM) radio transmitter which frequency modulates an input signal on one of a plurality of output channel frequencies, the FM radio transmitter comprising:

a phase lock loop including a controlled oscillator that produces the frequency modulated input signal on one of the plurality of output channel frequencies in response to a control input that is applied thereto;

a scaler that is responsive to the input signal and to a scaling constant to scale the input signal based upon the scaling constant and provide the scaled input signal to the phase lock loop to produce the frequency modulated input signal on one of the plurality of output channel frequencies; and an automatic deviation control system that measures the control input that is applied to the controlled oscillator when tuned to one of the plurality of output channel frequencies, estimates a tangential modulation sensitivity of the controlled oscillator using the measurement of the control input, and updates the scaling constant based on the estimated tangential modulation sensitivity.

2. An FM radio transmitter according to claim 1 wherein the automatic deviation control system computes a change of frequency of the controlled oscillator relative to a corresponding change in the control input that is applied to the controlled oscillator, based uon the measured control input, to estimate the tangential modulation sensitivity of the controlled oscillator.

3. An FM radio transmitter according to claim 1 wherein the automatic deviation control system first measures the control input that is applied to the controlled oscillator during manufacture thereof and sets the scaling constant based on the tangential modulation sensitivity estimated using the measurement of the control input during manufacture, and then measures the control input that is applied to the controlled oscillator during operation thereof after manufacture, and updates the scaling constant based on the tangential modulation sensitivity estimated using the measurement of the control input after manufacture.

4. An FM radio transmitter according to claim 1 wherein the automatic deviation control system measures the control input that is applied to the controlled oscillator at each of the plurality of output channel frequencies and repeatedly updates a plurality of scaling constants corresponding to the plurality of output channel frequencies based on the tangential modulation sensitivity estimated for each of the plurality of output channel frequencies using the measurements of the control input.

5. An FM radio transmitter according to claim 1 wherein the automatic deviation control system repeatedly measures the control input that is applied to the controlled oscillator at some of the plurality of output channel frequencies and repeatedly updates a plurality of scaling constants corresponding to the plurality of output channel frequencies based on the tangential modulation sensitivity estimated for each of the plurality of output channel frequencies using the measurements of the control input and interpolation.

6. An FM radio transmitter according to claim 5 wherein the interpolation is one of linear interpolation, quadratic interpolation or higher order interpolation.

7. An FM radio transmitter according to claim 1 wherein the automatic deviation control system measures the control input that is applied to the controlled oscillator in response to a user command.

8. An FM radio transmitter according to claim 1 wherein the automatic deviation control system repeatedly scans the controlled oscillator through the plurality of output channel frequencies, repeatedly measures the control input that is applied to the controlled oscillator at the plurality of output channel frequencies and repeatedly updates a plurality of scaling constants corresponding to the plurality of output channel frequencies based on the tangential modulation sensitivity estimated for each of the plurality of output channel frequencies using the measurements of the control input.

9. An FM radio transmitter according to claim 1 wherein the automatic deviation control system measures the control input that is applied to the controlled oscillator when power is applied to the FM radio transmitter.

10. An FM radio transmitter according to claim 1 wherein the automatic deviation control system repeatedly measures the control input that is applied to the controlled oscillator during frequency modulation of one of the plurality of output channel frequencies and repeatedly updates a plurality of scaling constants corresponding to the plurality of output channel frequencies based upon the tangential modulation sensitivity estimated for each of the plurality of output channel frequencies using the control input measurement for the one channel frequency.

11. An FM radio transmitter according to claim 1 wherein the automatic deviation control system comprises:

an analog-to-digital converter that converts the control input into a digital signal; and a control processor that is responsive to the digital signal to calculate the scaling constant; and wherein the scaler comprises a digital signal processor that is responsive to the input signal and to the scaling constant, to scale the input signal based upon the scaling constant and provide the scaled input signal to the phase lock loop to produce the frequency modulated input signal on one of the plurality of channel frequencies.

12. An FM radio transmitter according to claim 1 wherein the phase lock loop comprises:

a phase detector that is responsive to a reference frequency and to an error input, to detect phase differences therebetween;

a loop filter that is responsive to the phase detector to provide a filtered error signal to the controlled oscillator; and a fractional divider that is responsive to the controlled oscillator, to produce the error input.

13. An FM radio transmitter according to claim 1 wherein the input signal is a cellular radiotelephone input signal and wherein the plurality of output channel frequencies are a plurality of cellular telephone channel frequencies.

14. A deviation controlling method for a frequency modulation (FM) radio transmitter which frequency modulates an input signal on one of a plurality of output channel frequencies, the FM radio transmitter comprising a phase lock loop including a controlled oscillator that produces the frequency modulated input signal on one of the plurality of output channel frequencies in response to a control input that is applied thereto; and a scaler that is responsive to the input signal and to a scaling constant to scale the input signal based upon the scaling constant and provide the scaled input signal to the phase lock loop to produce the frequency modulated input signal on one of the plurality of output channel frequencies; the deviation setting method comprising the steps of:

measuring the control input that is applied to the controlled oscillator when tuned to one of the plurality of output channel frequencies;

estimating a tangential modulation sensitivity of the controlled oscillator using the measurement of the control input; and updating the scaling constant based on the estimated tangential modulation sensitivity.

15. A method according to claim 14:

wherein the estimating step comprises the step of computing a change in frequency of the controlled oscillator relative to a corresponding change in the control input that is applied to the controlled oscillator, based upon the measured control input.

16. A method according to claim 14 wherein the measuring and updating steps comprise the steps of:

first measuring the control input that is applied to the controlled oscillator during manufacture thereof and setting the scaling constant based on the tangential modulation sensitivity estimated using the measurement of the control input during manufacture; and then measuring the control input that is applied to the controlled oscillator during operation thereof after manufacture, and updating the scaling constant based on the tangential modulation sensitivity estimated using the measurement of the control input after manufacture.

17. A method according to claim 14 wherein the measuring and updating steps comprise the steps of:

measuring the control input that is applied to the controlled oscillator at each of the plurality of output channel frequencies; and updating a plurality of scaling constants corresponding to the plurality of output channel frequencies based on the tangential modulation sensitivity estimated for each of the plurality of output channel frequencies using the measurements of the control input.

18. A method according to claim 14 wherein the measuring and updating steps comprise the steps of:

measuring the control input that is applied to the controlled oscillator at some of the plurality of output channel frequencies; and updating scaling constants corresponding to others of the plurality of output channel frequencies based on the tangential modulation sensitivity estimated for the others of the plurality of output channel frequencies using the measurements of the control input and interpolation.

19. A method according to claim 14 wherein the measuring step is initiated in response to a user command.

20. A method according to claim 14 wherein the measuring and updating steps comprise the steps of:

scanning the controlled oscillator through the plurality of output channel frequencies;

measuring the control input that is applied to the controlled oscillator at the plurality of output channel frequencies; and updating a plurality of scaling constants corresponding to the plurality of output channel frequencies based on the tangential modulation sensitivity estimated for each of the plurality of output channel frequencies using the measurements of the control input.

21. A method according to claim 14 wherein the measuring step is initiated when power is applied to the FM radio transmitter.

22. A method according to claim 14 wherein the measuring and updating steps comprise the steps of:

measuring the control input that is applied to the controlled oscillator while tuned to one of the plurality of output channel frequencies; and updating scaling constants corresponding to more than one of the plurality of output channel frequencies based upon the tangential modulation sensitivity estimated for each of the more than one of the plurality of output channel frequencies using the control input measurement for the one channel frequency.

23. A frequency modulation (FM) radio transmitter which frequency modulates an input signal on one of a plurality of output channel frequencies, the FM radio transmitter comprising:

a phase lock loop including a controlled oscillator that produces the frequency modulated input signal on one of the plurality of output channel frequencies in response to a control input that is applied thereto;

a scaler that is responsive to the input signal and to at least one scaling constant to scale the input signal based upon the at least one scaling constant and provide the scaled input signal to the phase lock loop to produce the frequency modulated input signal on one of the plurality of output channel frequencies; and an automatic deviation control system that repeatedly measures the control input that is applied to the controlled oscillator when tuned to some of the plurality of output channel frequencies and repeatedly updates scaling constants for all of the plurality of output channel frequencies by interpolation.

24. An FM radio transmitter according to claim 23 wherein the interpolation is one of linear interpolation, quadratic interpolation, or higher order interpolation.

25. A deviation controlling method for a frequency modulation (FM) radio transmitter which frequency modulates an input signal on one of a plurality of output channel frequencies, the FM radio transmitter comprising a phase lock loop including a controlled oscillator that produces the frequency modulated input signal on one of the plurality of output channel frequencies in response to a control input that is applied thereto; and a scaler that is responsive to the input signal and to at least one scaling constant to scale the input signal based upon the at least one scaling constant and provide the scaled input signal to the phase lock loop to produce the frequency modulated input signal on one of the plurality of output channel frequencies; the deviation setting method comprising the steps of:

measuring the control input that is applied to the controlled oscillator when tuned to some of the plurality of output channel frequencies; and updating scaling constants for others of the plurality of output channel frequencies by interpolation in response to the measured control input.

\* \* \* \* \*